US005510230A

United States Patent [19]
Tennant et al.

[11] Patent Number: 5,510,230
[45] Date of Patent: Apr. 23, 1996

[54] DEVICE FABRICATION USING DUV/EUV PATTERN DELINEATION

[75] Inventors: Donald M. Tennant, Freehold; Donald L. White, Morris Plains; Obert R. Wood, II, Little Silver, all of N.J.

[73] Assignee: AT&T Corp., Murray Hill, N.J.

[21] Appl. No.: 326,444

[22] Filed: Oct. 20, 1994

[51] Int. Cl.$^6$ .................................................. G03F 7/20
[52] U.S. Cl. ...................... 430/325; 430/311; 430/396; 250/492.2; 250/492.3
[58] Field of Search ........................ 430/311, 313, 430/322, 323, 325, 396; 250/492.2, 492.3

[56] References Cited

U.S. PATENT DOCUMENTS

| | | | |
|---|---|---|---|
| 4,890,309 | 12/1989 | Smith et al. | 378/35 |
| 5,315,629 | 5/1994 | Jewell et al. | 378/34 |
| 5,328,784 | 7/1994 | Fukuda | 430/5 |
| 5,339,346 | 8/1994 | White | 378/34 |

OTHER PUBLICATIONS

Y.-C. Ku, et al., "Use of a pi-phase shifting x-ray mask to increase the intensity slope at feature edges", *J. Vac. Sci. Technol.* B 6(1) Jan./Feb. 1988.

J. E. Bjorkholm, et al., "Reduction imaging at 14 nm using multilayer-coated optics: Printing of features smaller than 0.1 μm", *J. Vac. Sci. Technol.* B 8(6) Nov./ Dec. 1990.

D. W. Berreman, et al., "Use of trilevel resists for high-resolution soft-x-ray projection lithography", *Appl. Phys. Lett.* 56(22), p. 2180 May 1990.

A. E. Novembre, et al., "A sub-0.5 μm Bilevel Lithographic Process Using the Deep-UV Electron-Beam Resist P(SI-CMS)", *Polymer Engineering and Science* vol. 29, No. 14, Jul. 1989.

D. M. Tennant, et al., "Defect repair for soft x-ray projection lithography masks", *J. Vac. Sci. Technol.* B 10(6) Nov./Dec. 1992.

G. N. Taylor, et al., "Silylated positive tone resists for EUV lithography at 14 nm", *Microelectronic Engineering*, vol. 23, p. 279 (1994).

G. N. Taylor, et al., "Self-assembly: its use in at-the-surface imaging schemes for microstructure fabrication in resist films", *Microelectronic Engineering* vol. 23, p. 259 (1994).

*Primary Examiner*—Kathleen Duda
*Attorney, Agent, or Firm*—George S. Indig

[57] ABSTRACT

The fabrication of integrated circuit devices built to design rules of 0.18 μm and below uses patterning radiation in the EUV spectrum. Optimized processing conditions take advantage of independently developed EUV characteristics such as short resist absorption lengths.

7 Claims, 2 Drawing Sheets

DEVICE FABRICATION USING DUV/EUV PATTERN DELINEATION

TECHNICAL FIELD

Fabrication of Large Scale Integrated circuits and other devices having submicron features entailing projection lithography by use of extreme ultraviolet delineating radiation.

TERMINOLOGY

EUV—"Extreme Ultraviolet" electromagnetic radiation—radiation within the wavelength range of from 3 nm to 50 nm. This wavelength range is sometimes described as "soft x-ray".

Vacuum Ultraviolet—Electromagnetic radiation in the wavelength range of from 50 nm to 150 nm. Sometimes known as "Deep UV", such radiation is highly absorbed in usual optical materials which are transmissive at longer wavelengths—an absorption, which like that of the EUV, suggests use of reflecting, rather than transmitting, optics.

Proximity X-ray—A lensless, one-to-one (mask-to-image), lithography system in which the information-containing mask is in near-contact with the image plane.

Image—Replicated mask pattern as produced: on the focal plane ("aerial image"); upon exposure in the resist ("exposed image"); upon development of the exposed image ("developed image"); as used for masking device-functional material ("masking image").

Exposed Image—Constituting the latent image produced upon exposure to patterning radiation.

Developed Image—Images produced upon development of the exposed image. Depending upon resist tone, retained resist material constituting these images may correspond with light or dark regions of the aerial images.

Wavelength—Unless otherwise noted or implicit, reference to wavelength of delineating radiation is as measured in vacuum.

Leaky Phase Mask—A phase mask in which deliberate passage of illuminating radiation through blocking regions destructively interferes with edge-scattered radiation to lessen scatter-blurring of feature edges. The structure is sometimes referred to as an "attenuated phase mask".

Radiation Coherence—Reference is made to spatial coherence of delineating radiation in terms of Filling Factor, σ—i.e. by reference to the degree of coherence yielded by a system satisfying the relationship:

$$\sigma = \frac{NA \text{ of condenser}}{NA \text{ of lens}} \qquad \text{Eq. (1)}$$

In accordance with the relationship, a σ value of zero indicates 100% coherence.

Transmission (followed by a parameter such as absorption value)—The description contemplates reflective optics and masks. In conventional usage, the round-trip experience of the radiation is described as though it had undergone one-way passage through an analogous transmission element.

DESCRIPTION OF RELATED ART

It is generally agreed that "next generation LSI" —LSI built to design rules of 0.25 μm or smaller, will require delineating radiation of shorter wavelength than that in the presently-used "near ultraviolet" spectrum. Shorter wavelengths in the deep ultraviolet spectrum (DUV), e.g., at wavelength values of 248 nm initially, and eventually of 193 nm, should be satisfactory for design rules of 0.25 μm and, approaching 0.18 μm. Two candidates are being pursued for use with still smaller design rules. The first uses accelerated charged particles—electrons or ions. The second uses electromagnetic radiation beyond the DUV. Radiation in the EUV spectrum (λ=3 nm–50 nm) is under study for fabrication of 0.18 μm devices, and is prospectively useful for smaller design rules, e.g., 0.10 μm and smaller.

Proximity x-ray is, at this time, the most advanced short wavelength delineation technique. A typical system operates at a wavelength in the range of from 0.6 to 1.8 nm. Thin gold or tungsten membrane masks spaced 5 to 10 μm from the wafer to avoid mask damage, have yielded pattern images of 0.1 μm and smaller feature size. Diffraction and penumbra blurring at feature boundaries have been successfully addressed. Diffraction effects are inherently minimized by the short wavelength radiation. Resolution, for already-excellent resist materials, may be further improved by use of phase masks. See, Y. -C. Ku, et at., *J. Vac. Sci. Technol. B* 6, 150 (1988). Penumbra blurring is not a problem for synchrotron and small size plasma sources. The proximity system, still widely pursued, has a significant drawback. Masks, necessarily made to the same design rules as the image, ("1:1 masks") are expensive to fabricate and difficult to repair.

Projection systems providing for image reduction permit use of less expensive, larger-featured masks—features perhaps 5 or more times larger than that of the desired image. Unfortunately, proximity x-ray technology is not transferable to projection. The 1.2 nm radiation, desirable for its lowered diffraction, commensurate with acceptable transmissivity in the membrane mask, is unsuited for transmission optics. Required values of refractive index and transmissivity are not available in otherwise suitable materials.

As a consequence, x-ray projection systems use reflective, rather than transmission optics. Since conventional single-surface mirrors have inadequate reflectivity, distributed mirrors—"Distributed Bragg Reflectors" (DBRs)—are used. (These are often called "multilayer mirrors" in the EUV literature.) Again, the 1.2 nm proximity printing wavelength range is unacceptable. Required index differences for suitable DBR structures are unavailable at this wavelength.

Substrate-supported DBRs and patterned metal layers, serve as reflecting masks. (Chromium layers, commonly used at longer wavelengths in the ultraviolet spectrum, are replaced by gold or germanium layers in the EUV spectrum.) Features as small as 0.05 μm have been printed in PMMA resist layers using delineating radiation of 13.9 nm wavelength. See, J. E. Bjorkholm, et al., *J. Vac. Sci. Technol. B* 8, 1509 (1990).

Another problem arises. While the gap-induced limitation of proximity printing is avoided—while the projection process offers a high resolution aerial image—appropriate resist materials—have not been found. Delineating EUV radiation is absorbed within a very thin surface layer—far too thin a layer to use as a stand-alone etch-barrier. In thicker, single material, resist layers, the underlying major portion is effectively unexposed, resulting in poorly defined profiles, and in unsatisfactory resolution.

The problem is under study. One approach is described in "Use of Trilevel Resist for High Resolution Soft X-ray Projection Lithography", D. W. Berreman, et al., *Appl. phys. Lett.*, vol. 56(22), 28 (1990). The reference describes a tri-level system constituted of a thin layer of photosensitive material, an underlying thin layer of germanium, and, finally, a thick layer of organic material. After developing the surface image, it is transferred to the silicon substrate in an etch step (in which the two underlying layers serve in succession as etch-barriers).

A promising approach uses a different form of "surface activated" resist, and a two-part process providing for transfer of a developed surface image into the underlying part of the resist.

The problem is most severe in the EUV spectrum for wavelengths greater than 10 nm, although it is still a concern at longer wavelengths (e.g. at 193 nm).

SUMMARY OF THE INVENTION

The invention is concerned with the fabrication of devices built to design rules of 0.18 μm or smaller. Patterning is by projection-reduction using radiation in the EUV spectrum. The high absorptivity for this radiation changes the role of the resist which now becomes a controlling factor in process design.

The inventive processes use state-of-the-art technology to relax resist constraints. In particular, improved edge definition, due to phase masking, offers processing advantages including a thicker exposed image and increased freedom in processing conditions; in exposure; in development; and in depth-of-field.

A common aspect of all included processes provides for a thickened "exposed image"— resulting from initial exposure to patterning radiation. Upon development, the mask pattern is of thickness greater than in conventional processing. This developed pattern may then serve to mask device-functional material, or it may be transferred into underlying masking material to yield a sail more robust mask pattern.

DETAILED DESCRIPTION

I. General—A consensus on the likely commercial form of EUV pattern delineation has been reached. Projection apparatus is likely to be all-reflecting and to use aspherical elements. Radially-dependent aberrations lead at least to preference for scanning, with use of an arc-shaped scanning region at constant radius from the optical axis.

The all-pervasive problem of short absorption distance for the EUV radiation leads to a variety of resist materials of sophisticated design. These are described with reference to the literature. All included processes use phase masking.

A particularly suitable "leaky" phase mask is described in companion U.S. patent application Ser. No. 08/326,449.

Figure 1:
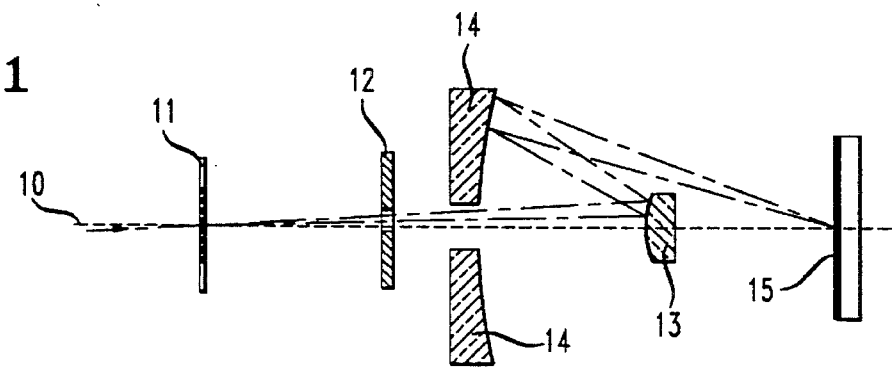
FIG. 1 is a schematic cross-sectional view of apparatus suitable for inventive use. This apparatus includes a phase mask operating in transmission.
Figure 2:
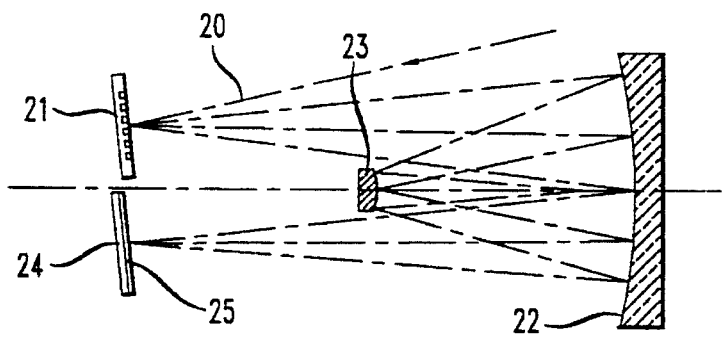
FIG. 2 shows analogous apparatus, using a reflective phase mask.

II. Apparatus—Two forms of apparatus appropriate for inventive use are shown. That of FIG. 1 is ganged for use with a transmission mask—it is a Schwarzschild projector using two-element reflecting optics. That of FIG. 2 is an Offner ring field projector again, with two-element reflecting optics (but three reflections), suitably used with a reflection phase mask. Commercial apparatus is likely somewhat more complex—perhaps of the form shown in U.S. Pat. No. 5,315,629, issued May 24, 1994. The patented apparatus is all-reflective, 4 element, with aspherical correction.

Both figures show "normal incidence" reflection. (The terminology is to include usual deviation from normal incidence, required to avoid blocking when using reflective optics. Deviation of from a few degrees to about 25° from normal incidence is common practice.) State-of-the-art grazing-incidence optics introduce resolution-limiting aberrations and are generally non-preferred.

Figure 3:
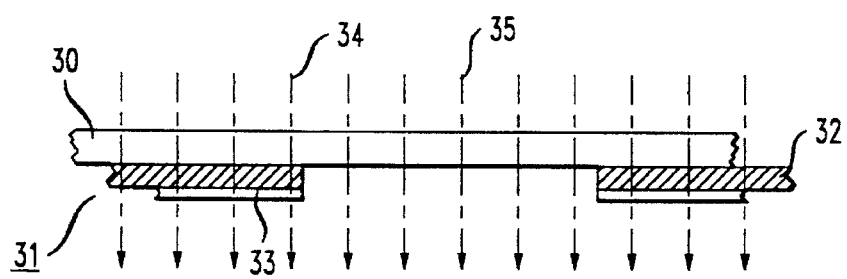
FIG. 3 is a schematic view of a transmission phase mask.

As used in Example 1, radiation 10 is 13.9 nm synchrotron wavelength (the 3rd harmonic of the VUV ring of the U13 Brookhaven undulator). Mask 11 consists of a patterned layer of germanium supported by a silicon membrane. (The mask used is shown in FIG. 3.) Both focusing elements use multilayer reflectors of appropriate material pairs. Individual pairs are graded in thickness in the radial direction to assure constant 180° phase delay for varying angle of incidence. In Example 1, the resist layer 15 is a 60 nm thick film of PMMA on silicon wafer 24. For the 13.9 nm radiation, a molybdenum/silicon multilayer is used.

FIG. 2 shows the equivalent system substituting a reflection mask. Incoming radiation 20 illuminates mask 21, and as modulated, is focused and directed by lens elements 22 and 23. The image is projected on layer 25 which is supported by wafer 24.

Proper design of EUV sources, whether synchrotron or plasma, is critical. Collection efficiency is a different problem for the two. Synchrotron emission is of changing angle—is tangential to the circular path of the accelerated particles. Emission forms an arc which is thin in the normal dimension. The emission pattern should be reshaped.

Synchrotron radiation is likely to be excessively coherent; plasma radiation, incoherent. Effective use requires modifying both.

Collection systems have been described. See U.S. Pat. application Ser. No. 08/059924, filed May 10, 1993, for synchrotron collection, and U.S. Pat. No. 5,339,346, Aug. 16, 1994 for plasma collection.

III. Mask—Processes herein preferably use "leaky" phase masks (attenuated phase masks) operating on the principle of U.S. Pat. No. 4,890,309, issued 1989. Masks may operate in transmission (Example 1) or, in reflection, (Example 2)—reflection masks are preferred for the inventive purposes, since less lossy and more robust. Co-filed U.S. Pat. application Ser. No. 08/326,449 describes and claims a leaky mask structure, operating in reflection.

Operating levels of attenuation and phase delay are the same, whether for one-way passage in transmission or for round-trip in reflection. Transmission in the range of from 5% to 15% has been found effective for cancellation of scattered radiation from clear regions. Greater transmission, to 25% may be tolerable, but is considered an upper limit. Depending on resist characteristics, resist removal in masked regions may become a problem. (Discussion is for simple structures in which there is no phase delay introduced in the clear regions. If, for some reason, this is not true, the phase delay of the blocking regions is adjusted to maintain a "differential" π shift, relative to the clear regions. This meaning is intended in this description.)

FIG. 3 shows an attenuated phase mask for operation in transmission. As used in Example 1, it consists of a 0.6 µm thick membrane 30, supporting a patterned bilayer 31 constituted of a 262 nm thick PMMA phase-shift layer 32, and a 27 nm thick germanium attenuation layer 33. The bilayer delivers the differential π phase shift with 25% transmission. The two functions may be served by a mixed, or "alloy" layer, or in the future may be met by an as-yet unidentified single-component material. The π phase difference is illustrated by "attenuated" rays and "clear" rays 34 and 35, with respective delays of 181° and 1°.

Figure 4:
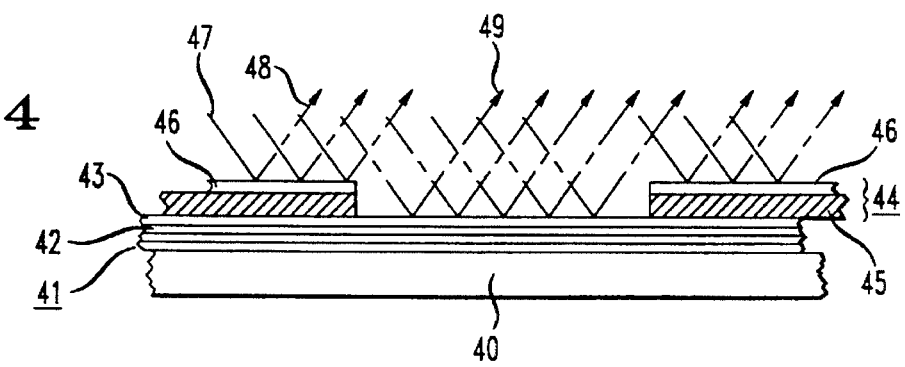
FIG. 4 is a schematic view of a reflecting phase mask.

The reflection structure of FIG. 4 shows a substrate 40, supporting a multilayer reflector 41 made of alternating high and low index materials 42 and 43. The patterned bilayer 44 is constituted of phase-shifter 45 and absorber 46. Radiation 47 is patterned by the mask to yield "attenuated" rays 48 and "clear" rays 49. These emitting rays have the same phase relationship as rays 34 and 35 of FIG. 3. The studied structure introduces 10% attenuation (in this instance, for round-trip passage). Radiation 47 is illustratively shown at an angle of incidence of approximately 65° (relative to the surface). Greater deviation from normal incidence, generally not required, may be used.

The leaky phase mask, while something of a compromise in reducing contrast—is simpler to construct and places no restriction on pattern design.

For temperature stability the mask substrate (substrate 40 of FIG. 4) is either a low expansion material or a high thermal-conductivity material. A mixed glass composition, of 92.6 wt % $SiO_2$ 7.4 wt % $TiO_2$, is a suitable low-expansion material. Elemental silicon is a suitable thermally-conductive material. Layer pairs of the multilayer reflector each introduce a phase delay of one or more half wavelengths so that the composite reflection is in phase. Alternating layers of silicon and molybdenum are suitable in the 13 nm–15 nm wavelength range (40 layer pairs give 60%–63% reflectivity in this range). Molybdenum/beryllium pairs have been used with radiation at λ=11.4 nm. Resist absorption is somewhat less at this wavelength, and reflectivities as high as 68.7% have been reported. (Theoretical reflectivity for Mo/Be DBRs is 80%.) Ruthenium and boron carbide multilayer mirrors have been used with 6.8 nm radiation. Thickness dimensions are here discussed for waves of normal incidence. Precise ML reflector design provides for one or multiple π delay/pair adjusted for deviation from normalcy.

As noted, bilayer 44 may be replaced by a single layer masking region, serving both for attenuation and phase shifting. The single layer may be composed of a single component, or two or more components forming a solid solution or fine mixture. An illustrative mixed layer is composed of an organo-silane serving for phase-shifting, and an iodine- or bromine-containing molecule for absorbing. The layer may use a heavy metal for absorption together with a lighter metal for phase shifting.

While the larger mask size, permitted by projection, reduces mask cost, repair continues to be a factor. Pin-hole repair is particularly problematic for binary layers. Repair of homogeneous layers—alloy or single material layers—serving both for shifting and attenuation—is simpler than for bilayers. Pin-holes may be plugged, using material deposited by the method used for the initial layer. Excess material may be removed by planarization—e.g., by use of an overlying organic layer selected to be etch-eroded at the same rate as that of the masking material.

Figure 5:
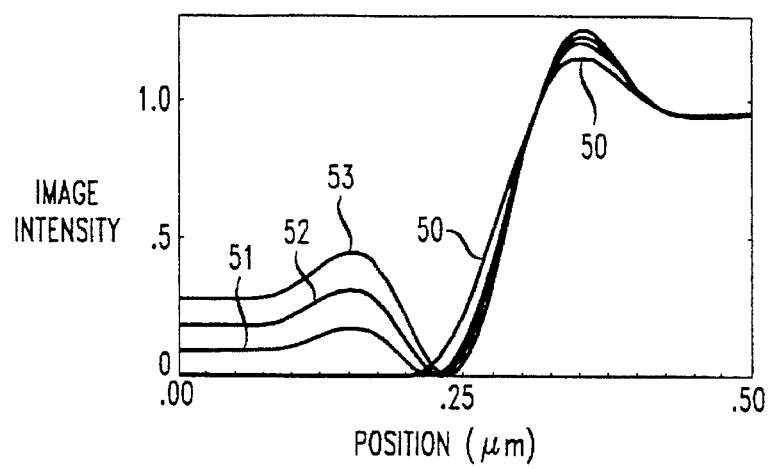
FIG. 5, on coordinates of image intensity and position, relates these characteristics for aerial images produced by mask structures of varying attenuation.

FIG. 5 shows a 0.50 µm wide part of an image using 0.50 µm lines and spaces. It shows a single feature edge (in the center of the span), bounded by a half line (left-hand portion) and a half space (right-hand portion). Ordinate units are image intensity. Aerial images for four values of mask attenuation are plotted. Curve 50 is a normal mask using blocking regions of 100% nominal opacity. Curves 51, 52 and 53 are for phase masks with varying transmission—curve 51 for 10%, curve 52 for 20%, and curve 53 for 30%. The feature edge is considered to lie at 0.25 µm on the abscissa. Improvement in edge definition is substantial to a transmission value of about 10% and improves only slightly for values greater than about 15%. The preferred range of transmission values is 5%–15% (2.5%–7.5% for one-way passage in a reflecting mask).

Mask patterning was by e-beam writing using Electron Beam Lithography, followed by reactive ion etching. Mask fabrication is described in D. M. Tennant, etal., *J. Vac. Sci. Technol. B*, vol. 10(6), 3134 (1992).

IV. Imaging Resist—The primary objective is to relieve processing limitations due to the high resist absorption. A 1/e attenuation thickness of 0.10–0.15 µm, in practice, leads to a resist thickness of 60–70 nm. This is too thin a layer to serve as stand-alone protection during etching. A number of innovative resist structures have been designed to solve the problem. Most provide for transfer of a thin surface image into underlying material in a separate step.

The "bilayer" approach uses a discrete surface layer, e.g. of an organo-metallic, light-sensitive material, and an underlying layer of organic material. A liquid developer has been used to generate an aperture-image in the surface layer. Transfer is by plasma etching. See, A. E. Novembre, et al. "A Sub-0.5 µm Bilevel Lithographic Process Using the Deep-UV Electron-Beam Resist P(SI-CMS)", *Polymer Engineering and Science* vol. 29, no. 14, p. 920 (1989).

In "near-surface" imaging, the thin surface image is developed by chemical crosslinking of the exposed regions, after which uncrosslinked regions are made resistant to plasma transfer, by use of an agent which selectively reacts in these regions. A form of the process uses silylation. See, G. N. Taylor, etal. "Silylated positive tone resists for EUV lithography at 14 nm", *Microelectronic Engineering*, vol. 23, p. 279 (1994).

In "at-the-surface-imaging", refractory films, chemically bonded to organic resist surfaces, provide a plasma resistant etching mask during image transfer. See, G. N. Taylor, etal. "Self-assembly; its use in at-the-surface imaging schemes for microstructure fabrication in resist films", *Microelectronic Engineering*, vol. 23, p. 259 (1994).

V. Processing Conditions—It is convenient to consider invention-specified processing conditions in terms of a unifying characteristic—of now-permitted increased thickness of the resist layer. In conventional lithographic fabrication, resist thicknesses was not a problem. Resist characteristics (sensitivity, response linearity, development, etc.) were accompanied by inherent absorption characteristics which permitted their use in convenient thicknesses. Occasionally, their transparency was too large, and absorbing material was added.

Resist characteristics in the EUV spectrum are quite different. High absorption requires very thin layers. An objective is to overcome disadvantages— pinholes, poor etch resistance—while retaining good dimensional control.

Phase masking offers a solution. Phase masking is valuable, not so much for finer features, but for steepened resist profile. This permits a thickened resist image.

A note in passing—the term, "initial resist image", describes the image produced by the patterning EUV radiation, which is then developed. This "initial developed image" may then serve in usual fashion to mask underlying device-functional material. Alternatively, it may be transferred into underlying masking material. This is done with the multi-layer resist approach as well as in other structures described in the preceding section.

1. Coherence—It has been conventional to operate at a coherence level of $\sigma \geq 50\%$. Required coherence is greater in the present work. The needed range is $\sigma=0.5$–$0.2$ with a preference for the narrower range $\sigma=0.45$–$0.25$. This is a balance between the coherence required for the destructive interference fundamental to phase masking, and spurious structure due to constructive interference.

2. Exposure—Increased image thickness requires increased exposure. An alternative way of viewing the invention is as permitting the necessary exposure. Exposure magnitude, "overexposure" in usual processing, is now permitted for a variety of reasons. For greater exposure, corresponding with increased resist penetration, produces lessened dimensional change, due to steeper profile. The required exposure is that for imaging through the thickest resist layer.

3. Development—This requirement, inter-related with exposure, is relaxed. Developer and development conditions need not be optimized solely for near-surface contrast. Higher edge definition permits use of a lower contrast, but more sensitive resist.

4. Design Rules—With permitted increased resist thickness, facility for small feature size improves. This is not due to "relaxation" in wavelength limitation, but to relative freedom from pinholes and thickness-dependent dimensional changes.

5. Radiation Wavelengths—Processing advantage permits some freedom in wavelength choice. Increased radiation wavelength, while of increased absorptivity, may offer advantage, in resist chemistry.

6. Optics—Experimental results reported in the literature have sometimes depended upon use of optical elements of near-hypothetical perfection. Cost of such elements may be prohibitive. The invention, in increasing edge definition, shows increased tolerance for the faulty image produced by imperfect optics.

7. Critical Dimension—"CD" is viewed as an important process qualifier. Steepened profile improves resolution, and accordingly, dimensional reliability.

8. Biasing—It is usual to specify processing conditions permitting use of unbiased masks. Improved profile steepness lessens need for distortion of mask features to compensate for dimensional variations due to increasing exposure. Changed values of equivalent parameters: development; choice of resist; etc., are relatively free of this consideration. Since the invention invariably yields a thicker resist pattern for any selected resist composition, it is appropriate to view resist layer thickness as the one pervasive advantage. It has been conventional practice to design processing conditions, for a thickness no greater than about ⅓ of the absorption depth (0.33 1/e)—a thickness resulting in a penetration intensity at least 70% of that of the surface intensity. A requirement of all processes of the invention is increased thickness—a thickness of at least 70% of the absorption depth, yielding a penetration intensity of no more than 50% of the surface intensity. Specific values are for PMMA. For higher contrast resists, it is possible to increase thickness beyond the 70% figure. Experimental work has yielded acceptable resolution for thicknesses of a full absorption depth. Such thicknesses approach the minimum requirement for reliability in a stand-alone resist layer.

An essential element of the invention is production of a latent image by mask-patterned exposure, followed by development, to produce an "initial image" of the required thickness—of a thickness greater than that of a penetration depth equal to 70% of the absorption distance. In single-layer resists, and in multi-layer resists, this initial pattern thickness corresponds with the thickness of the initial topmost or "resist layer". Under other circumstances, the thickness of the resist layer may exceed the thickness of the initial image, with subsequent transfer into underlying material, which, itself, part of the initial homogeneous resist layer. There may be chemical conversion following development or exposure. The silylated positive-tone resist is an example in which the developed pattern is altered to resist pattern transfer. Reference to "image thickness" is intended to be descriptive both of arrangements in which it corresponds with thickness of an initial discrete resist layer (whether or not transfer into underlying protective material is contemplated), and in which it results from patterning exposure which penetrates only part way through the layer.

Proper choice of resist takes nonlinearity into account. Resists are characteristically exponentially dependent on radiation intensity below some saturation value. Accordingly, there may be further improvement in contrast where threshold conditions are exceeded (so that some resist is removed from regions of peak constructive interference). Meaningful resist removal data, such as that of FIG. 7, should reflect differential removal.

Unwanted resist removal should not exceed some maximum. Residual material must be sufficient for error-free masking. This consideration is generally avoided for multi-layer resist structures, in which masking is largely due to material underlying the resist layer.

However described, the inventive processes give increased yield. This is true for less-than-perfect optics, surface smoothness, and layer thickness. They are sometimes used for processing freedom—may permit substitution of dry-developed, relatively insensitive resists. The improved aerial image is accompanied by greater depth of focus—again contributing process flexibility.

Figure 6:
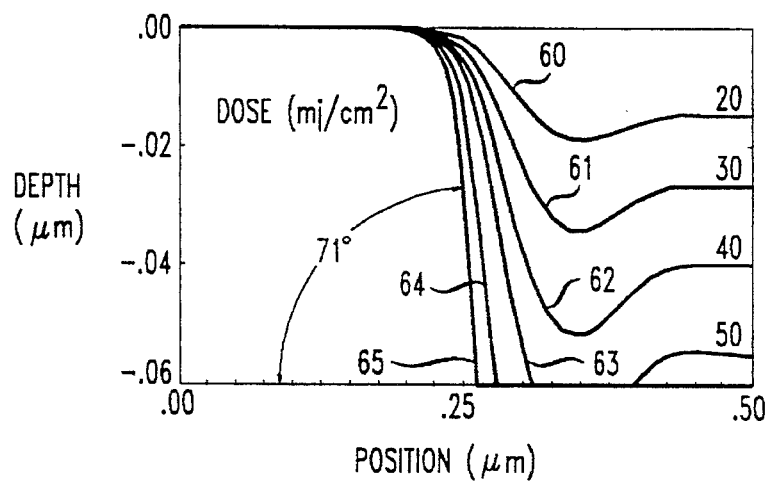
FIG. 6, in the same units of position, shows resist image characteristics resulting from aerial images of FIG. 5 for a normal (non-phase-shifting) mask.
Figure 7:
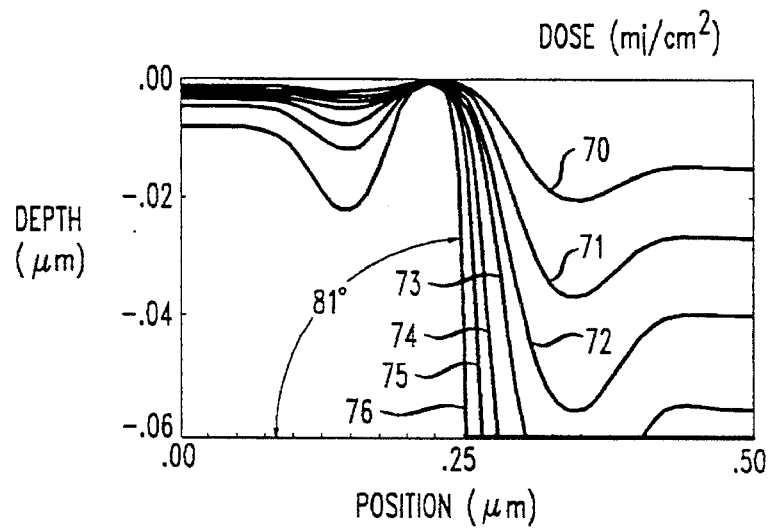
FIG. 7 shows the corresponding resist image characteristics when using an attenuated phase-shifting mask.

FIGS. 6 and 7 plot computer simulations for apparatus and process conditions used in the development of the data of FIG. 5. Abscissa units for the three figures correspond. All are based on: (a) 0.50 µm lines and spaces as viewed in the image plane; (b) a numerical aperture (NA) of 0.0835, for the camera; (c) a wavelength of 13.9 nm; (d) 100% coherence; (e) constant optimal phase shift of 180°. The information represents a "worst case" in low resist threshold and high coherence. It was used in designing processing conditions for the examples and is included for this purpose.

Ordinate units for FIGS. 6 and 7 are depth of resist removed during development of a surface image of 0.6 µm thickness. The curves show the improvement in the resist image produced by the improved aerial image. Values presented are for PMMA—a positive tone resist, so that removed areas correspond with bright areas of the aerial image. Negative tone resist data is similar, but with removal corresponding with dark areas of the aerial image.

The ordinate scale for FIGS. 6 and 7 extends from 0.00 µm (unexposed resist) to a maximum of −0.06 µm ("total" removal).

FIG. 6 is a plot of dose-dependent data describing a resist image produced by the aerial image using the normal mask of curve 50. Curves 60–65 are plotted for doses of 20, 30, 40, 50, 70 and 95 mJ/cm$^2$, respectively. Since there is no transmission through the masked region (that from 0.00 µm to 0.25 μm on the abscissa), no resist is removed in this region. For the dose range shown, sidewall angle (resist slope at the feature edge) increases with dose, reaching a maximum value of 71° for the 95 mJ/cm² dose of curve 65. A dose of 50 mJ/cm² was required for development of the full 0.06 μm thick image.

FIG. 7 presents the same data, but substituting a 10% transmission phase mask for the normal mask of FIG. 6. Curves 70, 71, 72, 73, 74, 75 and 76 represent dose values of 20, 30, 40, 50, 70, 95, and 144 mJ/cm², respectively. Sidewall slope has been increased substantially, attaining a value of 81° for a dose of 144 mJ/cm². Interference structure in the masked region becomes more pronounced with increasing dose—corresponding with increasing intensity for the corresponding region of the aerial image in FIG. 5.

Plotted data is for faithful replication of lines and spaces—generally preferred. Biased masks may serve the same purpose as for usual processing. There may be circumstances where the added expense and convenience are justified.

VI. Examples—A number of experiments were conducted. They vary in radiation wavelength, in degree of coherence, in radiation dose, etc. Much of the data presented is taken from experimental results.

Example 1—The apparatus as shown in FIG. 1—a 20:1 reduction, 0.0835 NA Schwarzschild projector, with a transmission phase mask, is used with 13.9 nm radiation to image 0.1 μm lines and spaces in a 0.07 μm thick "PMMA film". The mask, described as a FIG. 3 example, uses a bilayer of germanium and PMMA for phase shifting. Transmission is 25%. (While serving for experimental purposes, the transmission value exceeds the ~10% found adequate in other work.) Reflectivity of 60%–63% results from a 40-layer pair Mo/Si multilayer reflector.

Radiation, collected from a synchrotron and unprocessed, is near 100% coherent. A dose of 144 mJ/cm² yields sidewall characteristic of curve 76 of FIG. 7 (~81°).

Example 2—Example 1 is repeated, substantially unchanged, but using radiation of λ=11.4 nm. Choice of this wavelength is based on experimentally-shown increased absorption distance. While not experimentally verified in this work, it is reported that observed absorption distance in PMMA is 0.27 μm compared with 0.16 μm for 13.9 nm radiation. Multilayer mirrors using 50 molybdenum/beryllium pairs are 68.7% reflective.

Example 3—Example 1 is repeated with a 1:1 Offner projector, as shown in FIG. 2. The mask structure is shown in FIG. 4. 0.1 μm equal dimensioned lines and spaces are faithfully replicated.

We claim:

1. Process for device fabrication comprising at least one lithographic delineation step comprising projection-reduction of patterned radiation within the wavelength range of 150 nm–3 nm on a radiation sensitive resist layer, by means of a lens system constituted of reflecting optical elements to produce an aerial pattern image constituted of light and dark regions, in which the pattern includes features of minimum dimension less than 0.25 μm, by illumination of a phase mask with unpatterned radiation, thereby producing an exposed image, developing to produce a developed image, and thereafter masking entailing use of the developed image to selectively process device-functional material,

CHARACTERIZED IN THAT unpatterned radiation is of coherency within the range σ=0.5–0.2, in which exposed images are of a thickness at least 70% of the absorption distance, 1/e, for the radiation in the resist layer.

2. Process of claim 1 in which the developed image is transferred into underlying material so as to yield a masking image which is thicker than the exposed image.

3. Process of claim 2 in which underlying material is a discrete layer compositionally different from that of the resist layer.

4. Process of claim 2 in which the underlying material is part of the resist layer.

5. Process of claim 1 in which σ=0.45–0.25.

6. Process of claim 1 in which the radiation is within the wavelength range of 50nm–3nm.

7. Process of claim 6 in which the radiation is of a wavelength within the wavelength range of 50nm–10nm.

* * * * *